US010248032B1

(12) United States Patent
MacKay et al.

(10) Patent No.: US 10,248,032 B1
(45) Date of Patent: Apr. 2, 2019

(54) DUAL CONE-BASED POLARIZER

(71) Applicants: GOOCH AND HOUSEGO PLC, Somerset (GB); THE UNIVERSITY COURT OF THE UNIVERSITY OF GLASGOW, Glasgow (GB)

(72) Inventors: Peter Edward MacKay, Somerset (GB); Jonathan Gavin Ironside-Smith, Devon (GB); Sonja Franke-Arnold, Glasgow (GB); Neal Matthew Radwell, Glasgow (GB)

(73) Assignees: Gooch and Housego PLC, Somerset (GB); The University Court Of The University Of Glasgow, Glasgow (GB)

( * ) Notice: Subject to any disclaimer, the term of this patent is extended or adjusted under 35 U.S.C. 154(b) by 0 days.

(21) Appl. No.: 15/955,428

(22) Filed: Apr. 17, 2018

(51) Int. Cl.
*G02B 27/28* (2006.01)
*G03F 7/20* (2006.01)

(52) U.S. Cl.
CPC ....... *G03F 7/70566* (2013.01); *G02B 27/283* (2013.01); *G03F 7/70025* (2013.01); *G03F 7/70308* (2013.01); *G03F 7/70316* (2013.01); *G03F 7/70733* (2013.01)

(58) Field of Classification Search
None
See application file for complete search history.

(56) References Cited

U.S. PATENT DOCUMENTS

| 6,087,283 | A | 7/2000 | Jinbo et al. |
| 8,049,866 | B2 | 11/2011 | McCarthy |

OTHER PUBLICATIONS

N. Radwell, et al., "Achromatic vector vortex beams from a glass cone", Nature Communications, Sep. 7, 2015, pp. 1-6, DOI: 10.1038/ncomms10564, Nature Communications.
Angus MacLeod, "Thin Film Polarizers and Polarizing Beam Splitters", 2009 Summer Bulletin, pp. 24-29, Thin Film Center, Inc., Tucson, Arizona.

*Primary Examiner* — Michelle M Iacoletti
(74) *Attorney, Agent, or Firm* — Jetter & Associates, P.A.

(57) ABSTRACT

A cone-based polarizer includes a beam splitter including a front side (FS) and a back side (BS) part for receiving a first and a second beam portion, respectively. The FS part includes two prisms including parallel first and second FS hypotenuses, and the BS part includes two prisms including parallel first and second BS hypotenuses. A first TIR cone is on top and a second TIR cone is on a bottom of the beam splitter. The first and second TIR cones are aligned to have an essentially common cone axis direction and are configured to add a structured polarization upon retroreflecting. The first and second FS hypotenuses have a FS TIR interface in-between and are angled at about 45 degrees relative to the cone axis direction. The first and second BS hypotenuses have a BS TIR interface in-between and are angled at about 90 degrees relative to the FS hypotenuses.

16 Claims, 12 Drawing Sheets

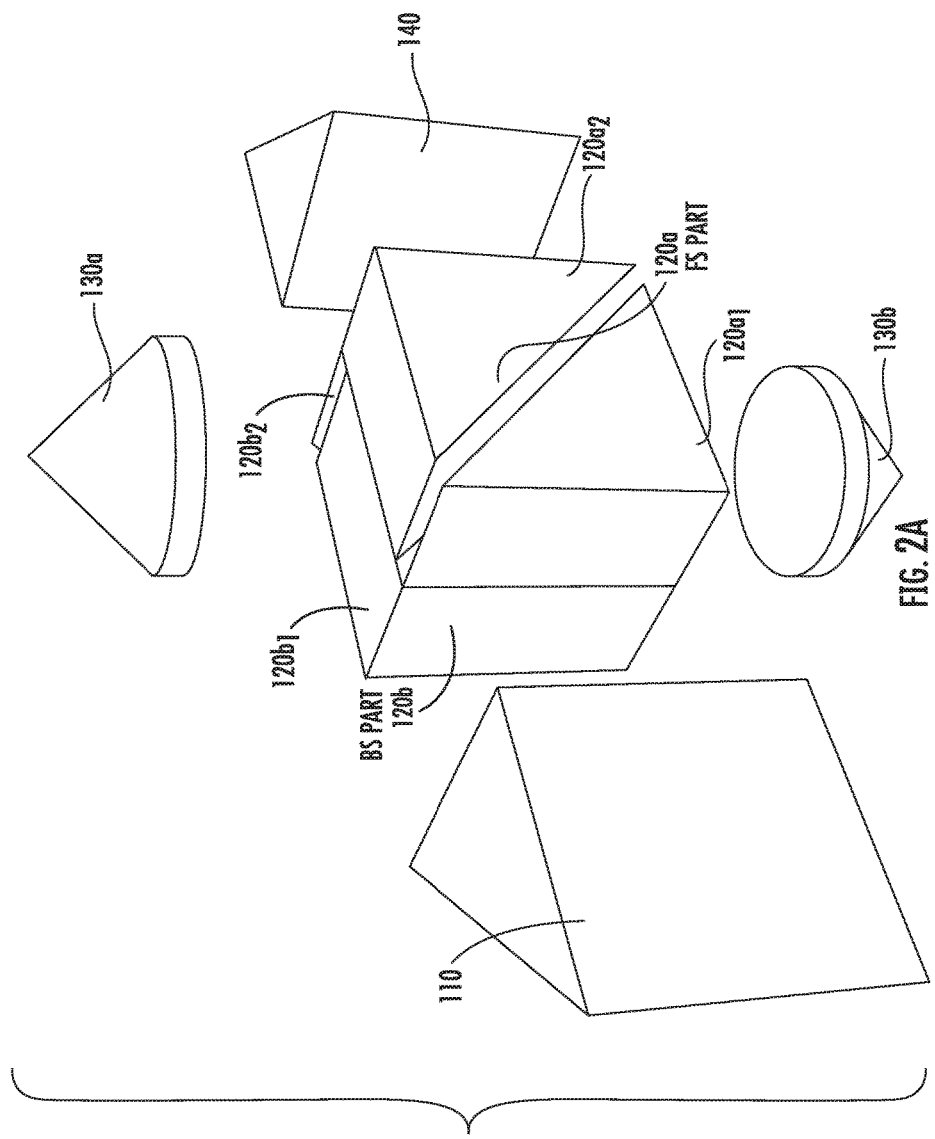

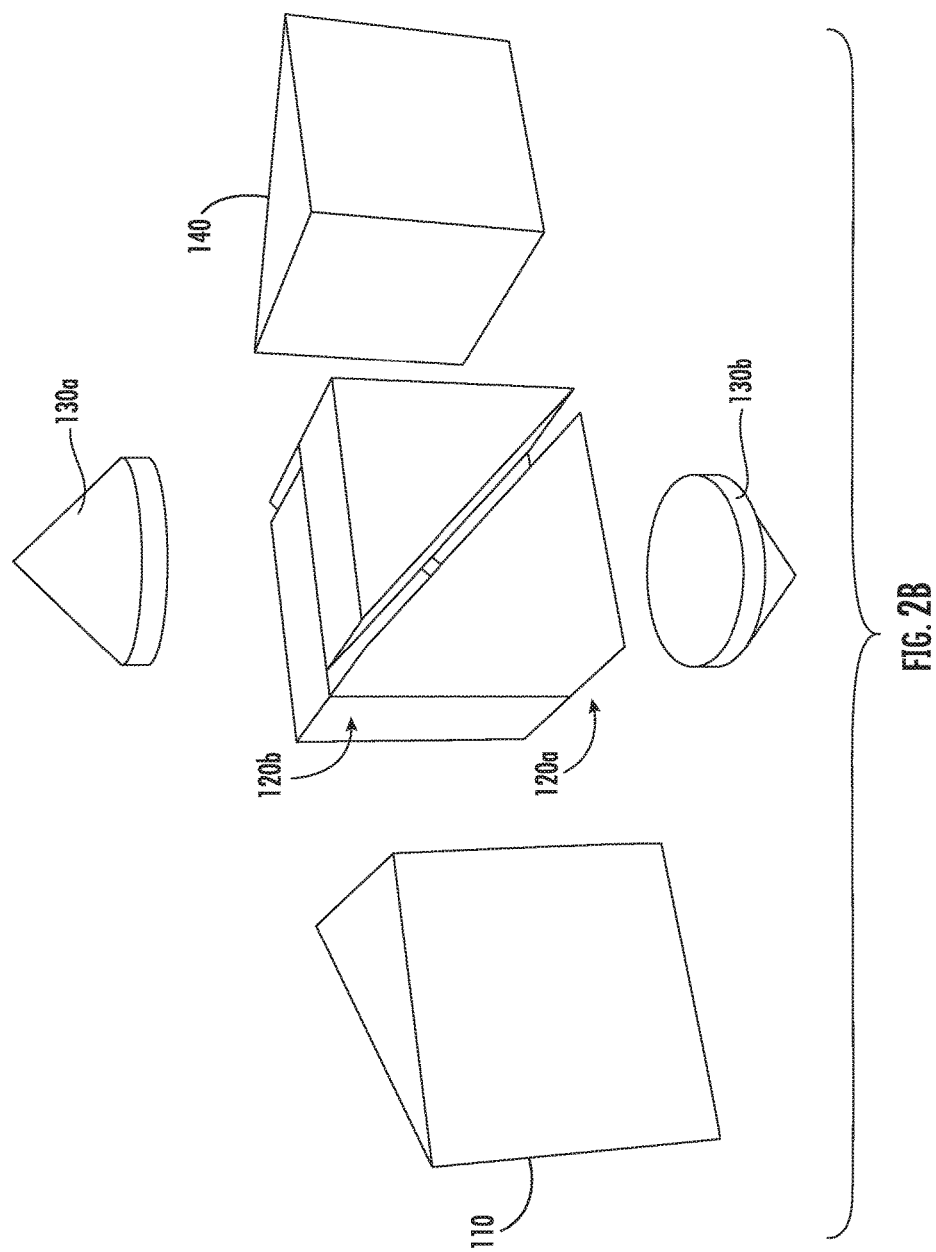

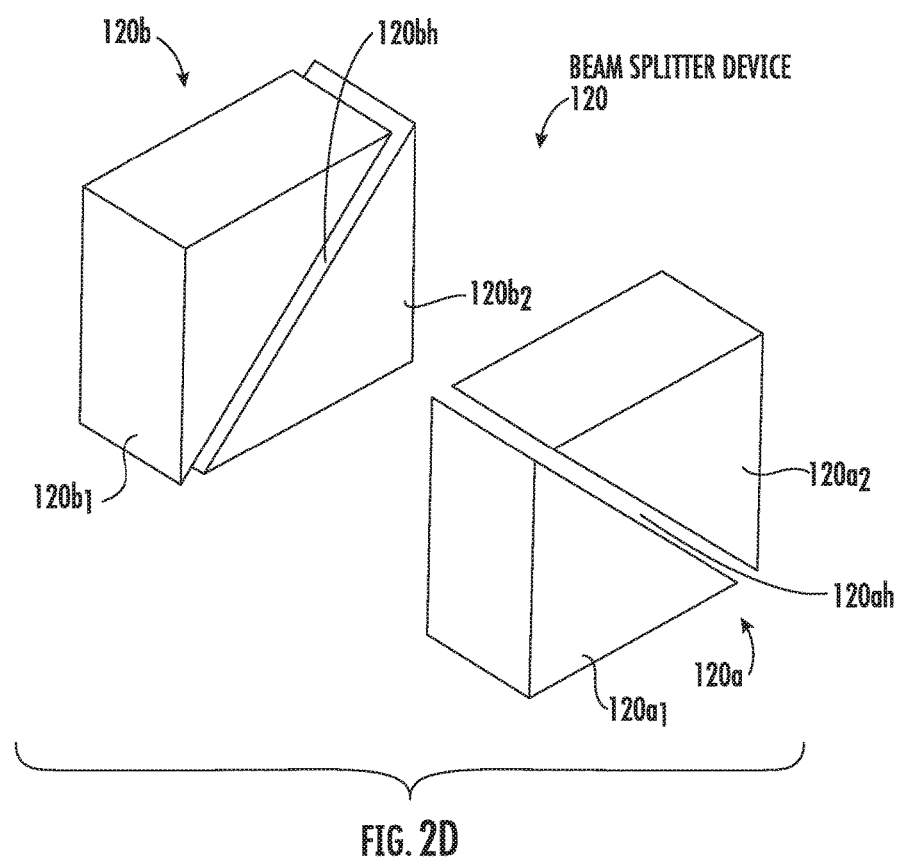

DUAL CONE-BASED POLARIZER

FIELD

Disclosed embodiments relate to cone-based optical polarizers.

BACKGROUND

Polarized light is well-known, and is used in applications ranging from high speed data transfer to quantum communication. A polarizer (or polariser) is an optical filter that allows light waves of a specific polarization to pass and block light waves of orthogonal polarizations, and thus can convert a light beam of undefined or mixed polarization into a beam of well-defined polarization. Linear polarizers can be divided into two general categories being absorptive polarizers where the unwanted polarization states are absorbed by the optical device, and beam-splitting polarizers where a beam is split into two beams with orthogonal polarization states. Polarizers which maintain the same axes of polarization with varying angles of incidence are generally called Cartesian polarizers, since the polarization vectors can be described with simple Cartesian coordinates (e.g., horizontal vs. vertical) independent from the orientation of the polarizer surface. When the two orthogonal polarization states generated are relative to the direction of a surface (usually found with Fresnel reflection), they are usually termed s and p polarizations, where light polarized in the plane of incidence is said to be p-polarized, while light polarized perpendicular to the plane of incidence it is said to be s-polarized.

Typical optical polarization applications use light with a uniform polarization, meaning light beams or light modes that have the same polarization at any position across the transverse beam (transverse to the optical axis of the beam). However, more recently light beams with structured polarization, where the polarization state varies across the transverse beam profile, have gained interest for research involving non-classical light fields. In particular, for radially polarized light beams, so-called vector vortex beams, where at any position within the polarization (electric field) vector points towards the center of the beam, have become known for their unique properties, including their improved focusing properties, such as for microscopy and laser cutting, and in vector-vortex coronagraphs for state-of-the-art astronomical telescopes.

Some polarized light applications attempt to generate radial and azimuthal polarization states (where all polarization vectors are orthogonal to the radial case) and optical states with non-zero values of optical angular momentum. In practice, an array of waveplate segments may be used to provide an approximation to a radially polarized beam. More accurate methods for generating radial and azimuthal polarization states and optical states with non-zero values of optical angular momentum include the use of super-structured waveplates (S-waveplates) comprising laser nano-structured glass. Such S-waveplates can generally provide fine polarization state detail.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known optical polarizers and methods for producing structured polarizations/vector vortex beams have drawbacks including being optimized for operation at only a single wavelength, and moreover have complicated designs Such known optical polarizers are generally expensive to produce and can be limited in aperture size (e.g., S-waveplates <6 mm). Transmissions levels provided can also be low. Disclosed dual cone-based polarizers (cone-based polarizers) include a first and a second total internal reflection (TIR) cone on opposite sides of a beam splitter device that comprises a front side (FS) part and back side (BS) part adapted for receiving a first beam portion and a second beam portion, respectively. The FS part comprises two prisms including parallel first and second FS hypotenuses, and the BS part comprises two prisms including parallel first and second BS hypotenuses. A first TIR cone is positioned on top of the beam splitter device and a second TIR cone 130b is positioned on a bottom of the beam splitter device.

The first and second TIR cones are aligned to have an essentially common cone axis direction (define herein as the cone axis directions being within 1° of one another) and are both configured to add a structured polarization upon retro-reflecting. The first and second FS hypotenuses have a FS TIR interface in-between and are angled relative to the cone direction at about 45° (defined herein as being angled at 45°±1°), and the first and second BS hypotenuses have a BS TIR interface in-between and are angled relative to first and second FS hypotenuses at about 90° (defined herein as being angled at 90°±2°).

Disclosed cone-based polarizer can also optionally include a right-angle prism at both the polarizer's input and output. This polarizer design uses two reflections at right-angles to one another to cancel each other out in order to transmit the input polarization state received from the input beam essentially unperturbed in to the TIR cones and back out. The input polarization can however be controlled externally rather than by including right-angle prisms at the input and output.

Disclosed cone-based polarizers recognize that there is a polarization change upon reflection at an angle because the s and p polarizations behave differently. In one arrangement, the input beam comprises a circularly polarized beam that is incident onto an input prism where the first reflection from this prism will in response output elliptical light because it is configured to introduce a 45±1° shift between the s and p polarization reflections. This phase shift however is reversed essentially exactly by the reflections inside the beam splitter device, and there is thus circular polarized light again going into the first TIR cone. At the polarizer output, again there is a reflection off two surfaces that essentially cancel out the relative phase shift. This phase shift cancelling aspect for disclosed polarizers is referred to herein as the s and p polarization shift due to all reflections from respective beams output by the first and second TIR cones being essentially zero defined herein as being within 1°.

When the cone-based polarizer include a right-angle prism at its input and at its output, the input right-angle prism can be aligned with regards to the other components of the overall polarizer, and the overall polarizer can also be aligned with respect to the input beam, or the input beam aligned with respect to the polarizer. This alignment is such that the angle of the incident input beam onto the input right-angle prism is about 45°, so that the incident angle with respect to the hypotenuse of the beam splitter FS and BS parts are both also about 45°. Although not generally needed, it is typically a good practice for the refractive index of these right-angle prisms be selected to match the refractive index beam splitter parts, generally being within 2% for avoiding reflections. For example, a 2% refractive index difference gives 0.01% loss and 20% refractive index difference gives a loss of 1%. However the refractive index should match between the right-angle prisms and beam splitter parts two parts to cancel out the phase changes on reflection, as different refractive indices give different changes on reflection, so that one may want to maintain at least a 5% refractive index matching.

The input right-angle prism provides a reflection in an orthogonal plane of incidence with respect to the plane of incidence the associated beam splitter part (e.g., the RS part) to provide polarization shift compensation so that the net s and p polarization shift for the beams portions that are input to the TIR cones are each essentially zero relative to the polarization state of the input beam. Analogously, the output right-angle prism is also configured as described above to provide a reflection in an orthogonal plane of incidence with respect to the plane of incidence of its associated beam splitter part (e.g., the FS part) to provide polarization shift compensation so that the net s and p polarization shift for the beams that are output by their respective TIR cone are also essentially zero. As used herein, a polarization shift for the beams that output by a TIR cone being essentially zero refers to being within 1°.

BRIEF DESCRIPTION OF THE DRAWINGS

Reference will now be made to the accompanying drawings, which are not necessarily drawn to scale, wherein:

FIGS. 2A-C shows the example cone-based polarizer shown in FIG. 1B with several exploded views to more clearly show its features, with FIG. 2A showing a basic exploded view of a cone-based polarizer, FIG. 2B showing an enhanced exploded view of a cone-based polarizer, FIG. 2C showing an orthographic exploded view of a beam splitter device, and FIG. 2D showing an exploded view of the portions of a beam splitter device.

DETAILED DESCRIPTION

Figure 1A:
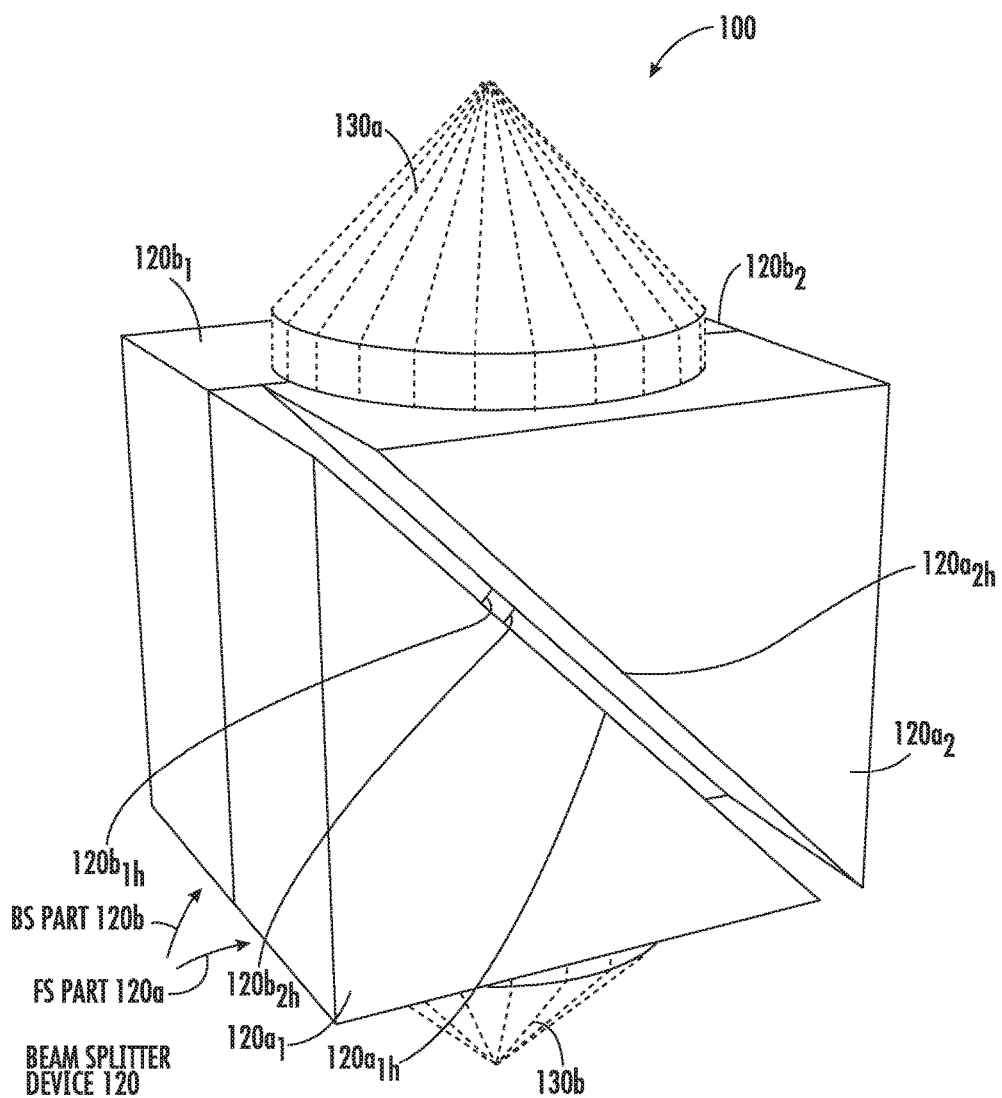
FIG. 1A shows a depiction of an example cone-based polarizer, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
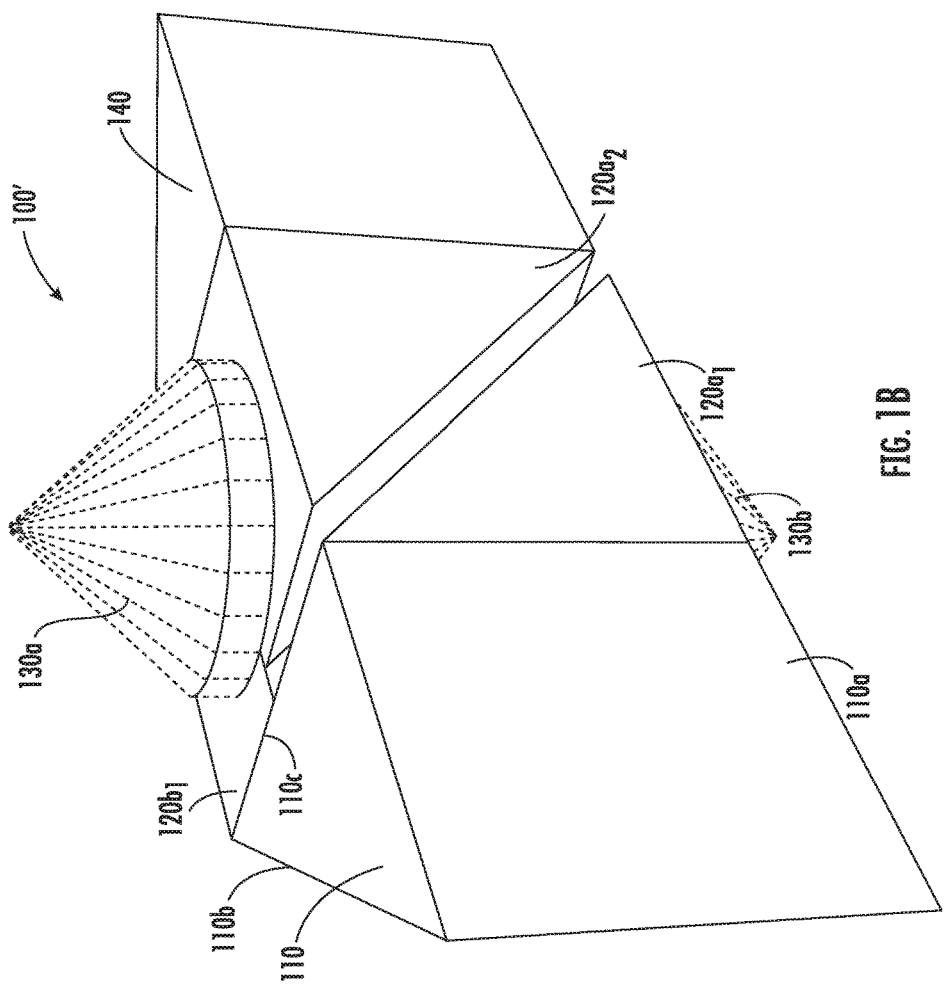
FIG. 1B shows a depiction of the cone-based polarizer shown in FIG. 1A with an added right-angle prism at both the input and the output according to an example embodiment.
Figure 1C:
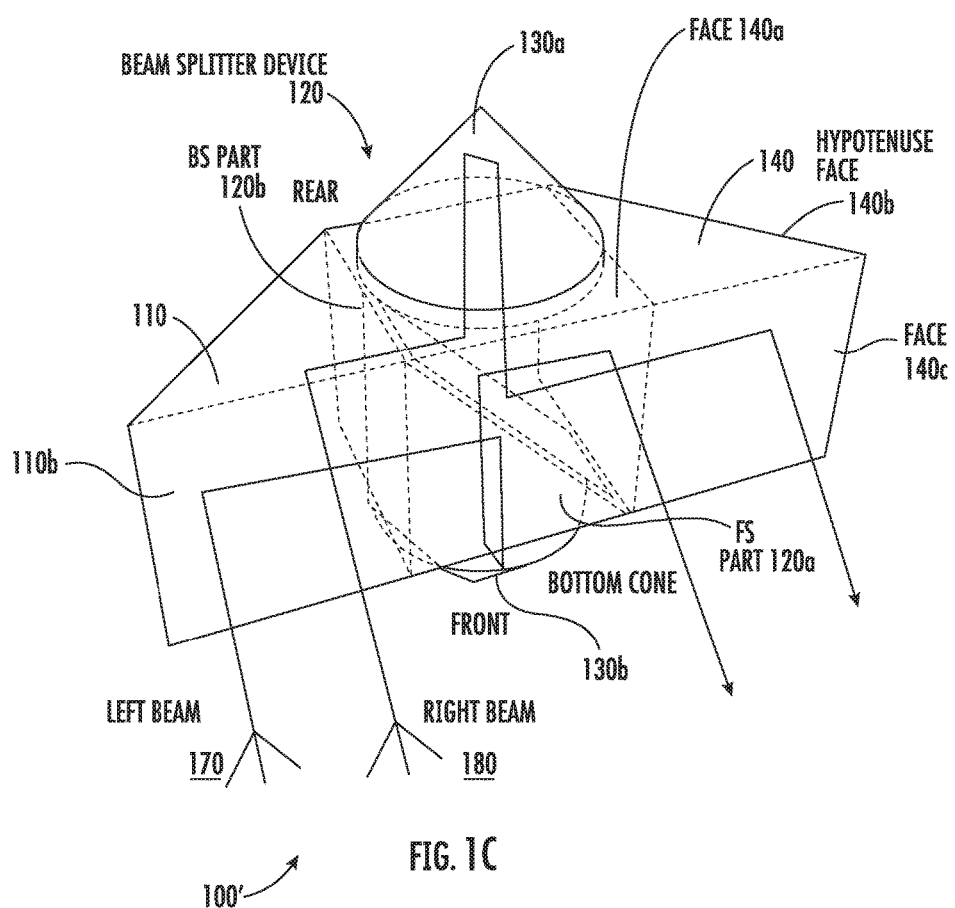
FIG. 1C shows the example cone-based polarizer in FIG. 1B with added ray traces shown.

FIG. 1A shows an example cone-based polarizer 100, according to an example embodiment, and FIG. 1B shows a depiction of the cone-based polarizer 100' shown in FIG. 1A with added right-angle prisms at both the input and the output, respectively. FIG. 1C shows the example cone-based polarizer 100' in FIG. 1B with added ray traces shown. The input beam shown in FIG. 1C although shown as a left beam portion 170 and a right beam portion 180, are actually portions of the same input beam, and the input beam as described below is not split into 2 separate beams until being split by the beam splitter device 120.

All the respective cone-based polarizer 100 or 100' components are shown physically contacted together thus being in the same physical space, and configured to generate an output beam having a desired structured polarization state. Various methods of assembly are generally acceptable including using optical cement for any of the component bonding. Disclosed cone-based polarizers may be bonded together as a unitary article. As described in more detail below, disclosed he cone-based polarizers can also work with air gaps between components of the polarizer assembly, for example between the beam splitter and the cones themselves.

Cone-based polarizers 100 and 100' includes beam splitter device 120 including a front side FS part 120a and a BS part 120b adapted for receiving a first beam portion and a second beam portion, respectively. The FS part 120a comprises two prisms 120a1 and 120a2 including parallel first and second FS hypotenuses 120a1h and 120a2h, and wherein the BS part comprises two prisms 120b1 and 120b2 including parallel first and second BS hypotenuses 120b1h and 120abh. A first TIR cone 130a is positioned on top of the beam splitter device 120 and a second TIR cone 130b positioned on a bottom of the beam splitter device 120.

The first and second TIR cones 130a, 130b are aligned to have an essentially common cone axis direction and are both configured to add a structured polarization upon retro-reflecting. The first and second FS hypotenuses 120a1h and 120a2h have a FS TIR interface in-between and are angled at about 45° relative to the cone direction, and the first and second BS hypotenuses 120b1h and 120b2h have a BS TIR interface in-between and are angled at about 90° relative to first and second FS hypotenuses.

As noted above the cone-based polarizer in FIG. 1B 100' modifies the cone-based polarizer in FIG. 1A to add right-angle prisms at both the input and the output, with input right-angle prism 110 oriented to receive an incident input beam, that can be circularly polarized or have another polarization. Left and right circular polarizations for the input beam will produce linear polarization everywhere, the angle of which rotates depending on the angle around the transverse section of the beam, which may be called the natural output. The natural output can be turned to radial or azimuthal polarized beam with a half waveplate. The difference between input right-handed and left-handed polarizations is that the output linear polarizations are all orthogonal to each other. Other input beam polarizations other than circular can also be used, but will not produce linear polarization everywhere and generally cannot be rotated to a radial or azimuthal polarized beam with a half waveplate.

The angle of incidence at the input right-angle prism 110 is at 90°±2° at a first of its faces 110a for being reflected from its hypotenuse face 110b and exiting through its other face 110c. As known in the art, a right-angle prism is constructed from a material having a refractive index greater than the square root of 2 so that the incident light will undergo a TIR at the glass/air boundary while inside the prism. The refractive index of the material for disclosed right-angle prisms such as input right-angle prism 110 and output right-angle prism 140 need not be generally be carefully controlled, only that the two adjacent components, being the prisms 110 and 140 and beam splitter 120 have the same refractive index, since any phase shift introduced is undone.

On the other hand, the TIR cones 130a, 130b generally need careful refractive index control, therefore if one wishes to avoid losses at the boundary of the beam splitter 120 and the cones 130a, 130b, then their refractive indices should be matched, although anti-reflection coatings can also be used. The materials selected for the input right-angle prism 110, for the output right-angle prism 140, and for the TIR cones 130a, 130b can be selected such that each reflection provides a difference in phase shift of about 45° defined herein as being 45°±1° between s and p components for an incidence angle of about 45 degrees for the first beam portion and the second beam portion, defined herein as being 45°±1°.

The FS part 120a and a BS part 120b of the beam splitter 120 are generally optically contacted to one another. The beam splitter device 120 provides both beam splitting (splits the input beam in half before the TIR cone 130a, 130b beam processing) and beam combining (after TIR cone 130a, 130b beam processing). This cube contacting aspect is more clearly shown by interface between the FS part 120a and BS part 120b in the basic exploded view of a cone-based polarizer in FIG. 2A described below. The prisms for each of the portions for the beam splitter device 120 can be joined by methods such as an adhesive or by contacting to minimize the bondline. In the case of an adhesive, the adhesive can comprise an optical adhesive such as a polyester, epoxy, or urethane-based adhesive. However, generally any way of contacting the beam spiller portions is acceptable provided the reflecting faces generally have an airgap to ensure that TIR takes place each time.

The FS part 120a comprises two right-angle prisms 120a1, 120a2 with its first hypotenuse 120ah having a TIR interface such as an air gap. The size range for the air gap is generally large enough to avoid a frustrated TIR, and small enough spacing to keep the beam portions nearly collinear. The air gap typically is greater than 3 wavelengths to reduce the frustrated TIR effect, typically >2 micrometers for visible light applications. The BS part 120b analogously comprises two right-angle prisms 120b1, 120b2 with its second hypotenuse 120bh also having an air gap. Setting the distance between prisms and keeping the beams parallel is known in the art. This allows the beams to undergo TIR at the hypotenuse face, from both sides of the prisms. At the front the diagonal is aligned one way and at the back a second pair of prisms with air gap are aligned with the hypotenuse in the opposite way. The four pieces of the beam splitter device 120 can be optically contacted to each other on the triangular faces so that the separation line that cuts the input beam into two semicircles is as small as possible. The separation line that can generally be tolerated will be application dependent. For example, for a 10 mm input beam size 100 μm may be negligible, but for a 1 mm beam size this is 10% of the beam diameter so it is generally not acceptable.

As an alternative to the above-described air gap, the FS part 120a and a BS part 120b can have a reflective surface at their interface between their prisms, such as a silver or other metal coating or a dielectric coating, so that no airgap is needed. However, reflective surfaces may affect the polarization states in a less controlled way as compared to an air gap at the prism interface, introducing phase shifts which are harder to correct, although the phase shifts are still generally predictable.

As described above the first TIR cone 130a is coupled to receive and reflect a first portion of the incident beam shown as right beam portion 180 in FIG. 1C that is reflected off the hypotenuse 120bh of the BS part 120b to arrive at the hypotenuse 120ah of the FS part 120a. The second TIR cone 130b is coupled to receive and reflect a second portion of the incident beam shown as left beam portion 170 that is reflected off the hypotenuse 120ah of the FS part 120a to arrive at the hypotenuse 120bh of the BS part 120b. The TIR cones are generally solid cones, such as solid glass cones. However, other possibilities for the TIR cones include hollow cones.

One can obtain a commercially available device called a cone mirror, which is a glass cylinder with a conical end, which has metal on the cone surface. The metal on the cone mirror is generally removed to provide TIR cones for disclosed cone-based polarizers. In operation, when a beam enters a TIR cone it will experience TIR upon reaching the glass-air interface. The input beam can be described by two orthogonal field components (say x and y field components) and the polarization of the beam is determined by the relative amplitude and phase of these two components. TIR alters the phase of the x and y components depending on the relative orientation of these components with the reflecting interface. The varying interface orientation at the surface of the TIR cones 130a, 130b results in spatially varying phase shifts. When considering the transverse plane in polar coordinates the phase shift is the same for every radius, but varying with the polar angle θ.

When the relative TIR phase shift between the two field components is pi/4, two subsequent reflections (naturally occurring in the TIR cone 130a, 130b) produce a shift of pi/2 converting circular polarization perfectly to linear polarization everywhere. The conical surface sets the angle of this linear polarization to be dependent on θ. If one imagines the beam overlaid on a compass, the pattern produced by a right hand circular input polarization would have diagonal polarization at the east and west positions, anti-diagonal at the north and south, vertical polarization at the north-east and south-west positions and horizontal polarization at the north-west and south-east position. The polarization angle between these positions varies continuously and smoothly. The output state for a left hand circular input polarization would be orthogonal to this for the right hand circular input polarization everywhere.

The polarization states can also be described as superpositions of left and right circular polarizations states with spatially varying phase. A beam with a phase which winds around the center (whose phase increases linearly with angle θ) is said to have an orbital angular momentum (OAM) of 1 units if the phase increases around the beam by 2lπ, where the small 'l' in 2lπ is the number of OAM units. On this basis an input right circular polarization becomes a linear superposition of a right circular polarization with 2 units of OAM and a left circular polarization with 0 units of OAM. These values are reversed for an input left circular polarization.

Input polarizations which are not perfectly circular will produce superpositions of these two polarization states.

These will have polarization states which vary with θ, and are generally comprise elliptical polarization states.

The generally ideal phase shift at each TIR interface of pi/4 (45°) can be achieved for a single wavelength by tuning of the refractive index of the TIR cones 130a, 130b following Fresnel's equations and broad-band operation can be achieved by tuning the dispersive properties of the glass material comprising selecting or engineering a glass to have a flat dispersion so that the refractive index is as close as possible to provide the optimal phase shift across the desired wavelength band. Non-optimal phase shifts (different from 45°) will generally result in an incomplete conversion of input circular polarization to linear polarization, producing elliptical polarization everywhere with the correct orientation angle.

The TIR cones 130a, 130b are generally essentially identical (i.e. designed to be identical) so that when the beam portions when recombined both have the same polarization properties. However, if one wanted the two halves of the beam outputted to have different polarization states, the TIR cones 130a, 130b can be different.

Again referring to FIG. 1C, the first hypotenuse 120ah is thus for reflecting the right beam portion 180 after first TIR cone 130a on the top processing and the second hypotenuse 120bh is for reflecting the left beam portion 170 on the bottom after second TIR cone 130b processing, both to the output right-angle prism 140. The output right-angle prism 140 is oriented to then receive at a perpendicular angle the left beam portion 170 and right beam portion 180 at one of its faces 140a for then being reflected from its hypotenuse face 140b and finally exiting the output right-angle prism 140 through its other face 140c. The geometry of the output right-angle prism 140 is such that the straight line of the semicircle is in the middle so that the recombined beam that is output is circular in shape.

Regarding operating of cone-based polarizer 100, assume a circular shape for the input beam with a circular polarization (as an example polarization) that is shown in FIG. 1C as left beam portion 170 and right beam portion 180. To direct the input beam into the TIR cones 130a, 130b there is at least one needed reflection at an incidence angle of about 45°. However, as described above a reflection at an angle changes the polarization state of the beam because the s and p polarizations behave differently. To compensate for this effect an additional reflection in the orthogonal plane to that of the beam splitter device 120 is provided by the input right-angle prism 110. Therefore, the s and p polarizations states swap between the first and second reflections and are essentially exactly compensated. This makes sure that the polarization state of the input beam is transferred essentially exactly to the TIR cones 130a, 130b.

If one follows the right beam portion 180, it reflects off the hypotenuse 110b of the input right-angle prism 110, then passes to the BS part 120b of the beam splitter device 120. The hypotenuse face of the BS part 120b reflects it up to the first TIR cone 130a where a TIR retroreflects it off the first TIR cone 130a which brings the right beam 180 forward and then down to the FS part 120a. The FS part 120a reflects it onward to the output right-angle prism 140 which is configured to provide the last reflection surface for compensating the polarization state scrambling by the last reflection performed by the FS part 120a and the BS part 120b.

Similarly the left beam 170 reflects once off the hypotenuse of the input right-angle prism 110, reflects down by the FS part 120a and gets transferred by the bottom TIR cone 130b to the BS part 120b by two reflections off the bottom TIR cone 130b to reach the BS part 120b where it is reflected to the output right-angle prism 140 which combines the right beam and left beam. As noted above, there are no lossy 50:50 beam splitters in the beam path so that there are no inherent optical losses and the polarization states are also controlled to make them easily accessible. Known cone-based polarizers for generating structured polarization beams generally require a compensating element to be inserted into the optical train to remove the polarization effects of some surfaces making the device much more complicated and difficult to make white light compatible.

Figure 2C:
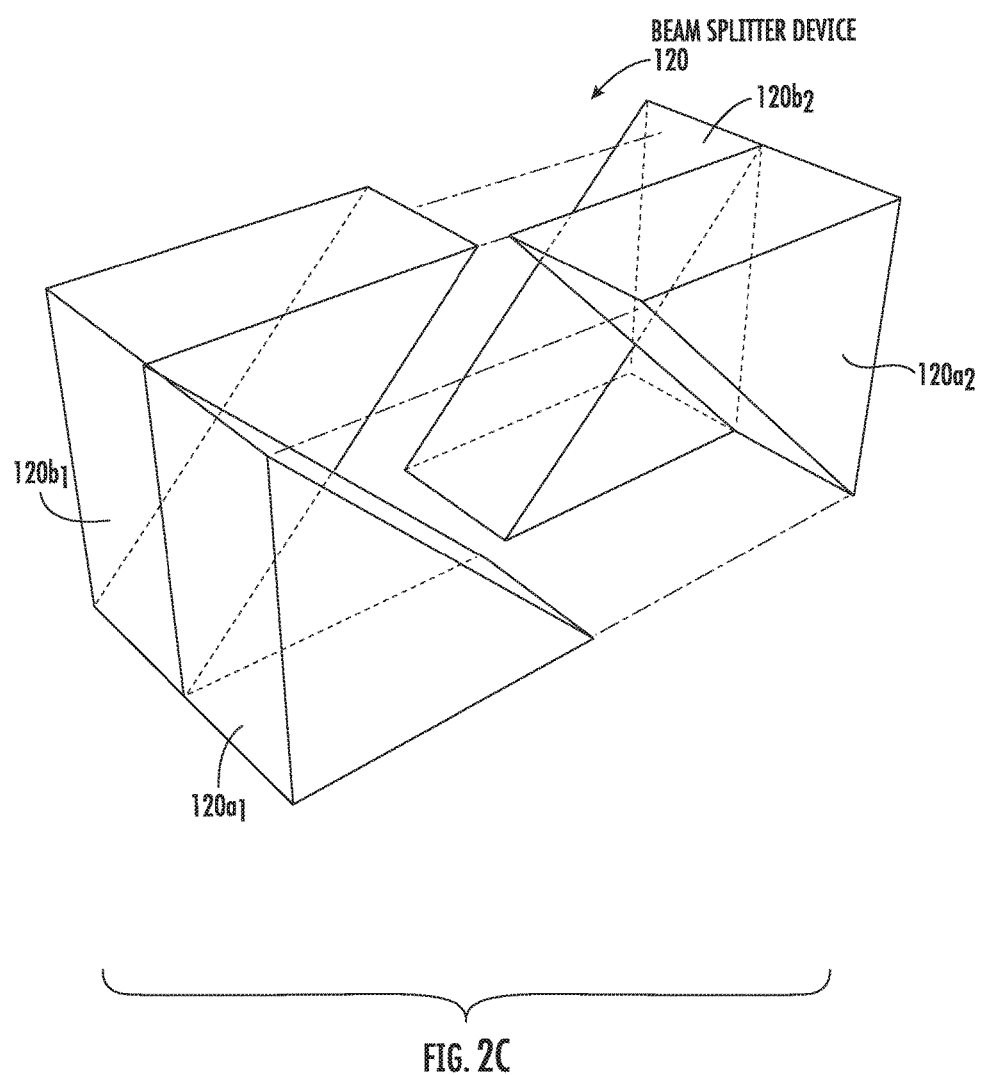

FIGS. 2A-C show the example cone polarizer 100' in FIG. 1B with several exploded views to more clearly show its features. FIG. 2A shows basic exploded view of cone-based polarizer 100'. The BS part 120b is bonded to the FS part 120a. FIG. 2B is an enhanced exploded orthographic view of a cone-based polarizer. FIG. 2C an orthographic exploded view of a beam splitter device 120 showing the beam splitter 120 separated along the air gaps, while FIG. 2D is an exploded view of the FS part 120a and BS part 120b of the beam splitter device 120.

Figure 3A:
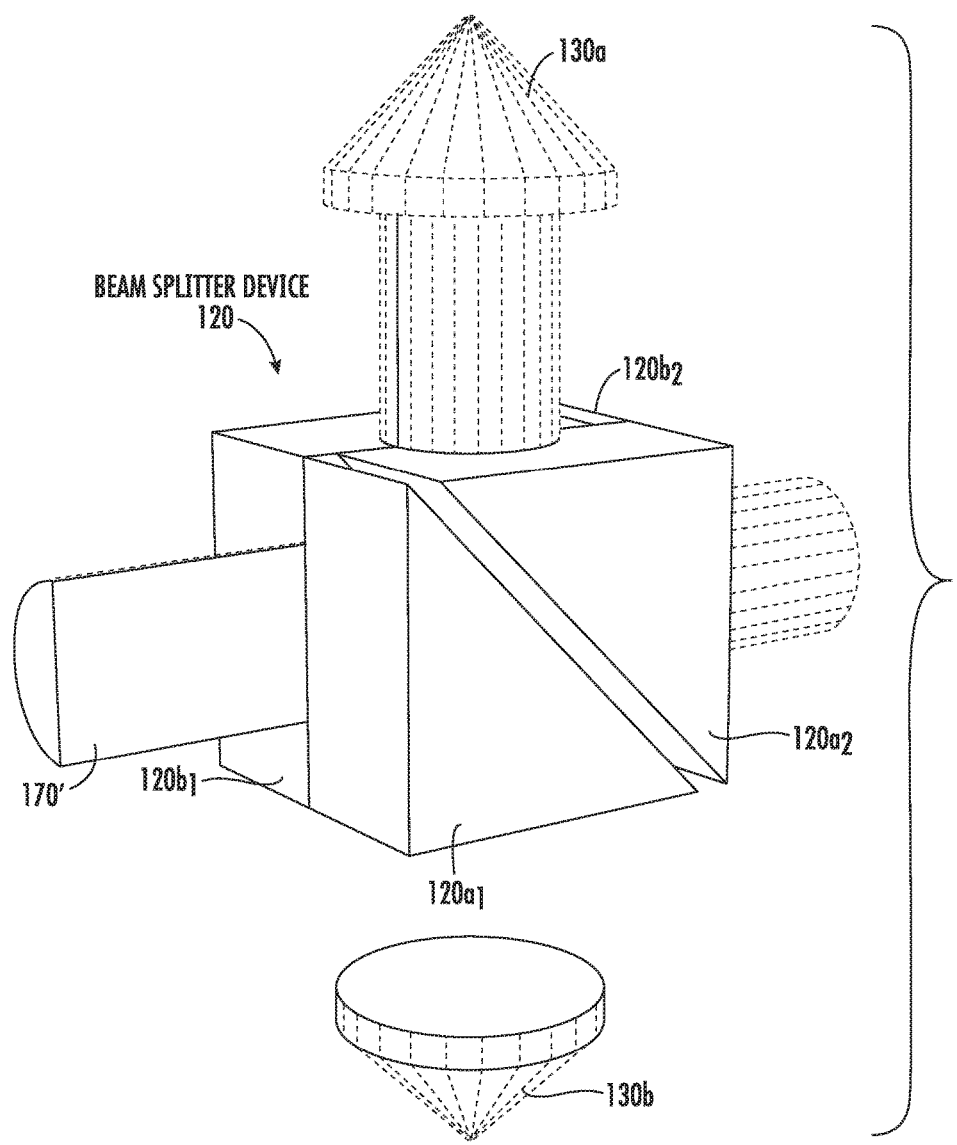
FIGS. 3A-C shows the example cone-based polarizer in FIG. 1B with FIG. 3A being a basic exploded beam path view, FIG. 3B being a left beam portion path view which is directed up to the top TIR cone by the BS part of the beam splitter device, and FIG. 3C being a right beam portion path view which is directed down to the bottom TIR cone by the FS part of the beam splitter device.
Figure 3B:
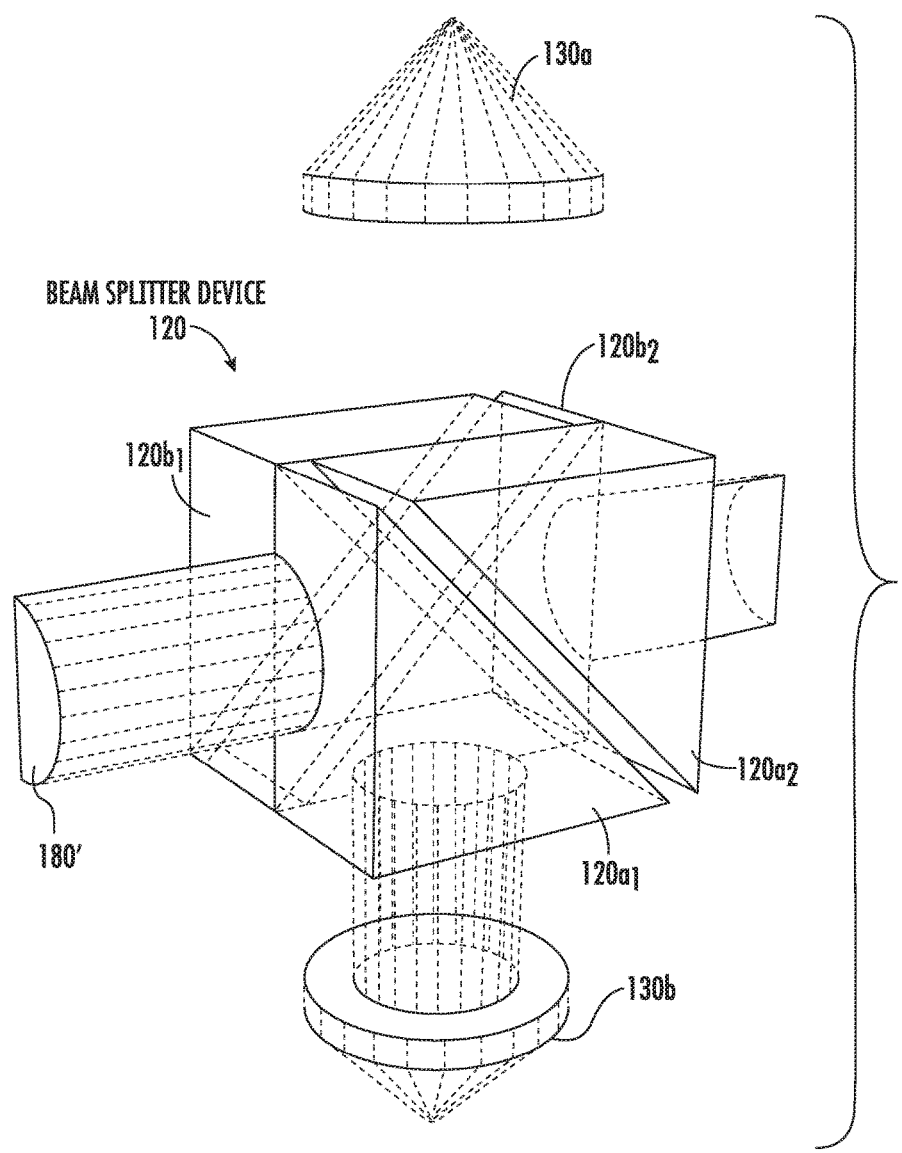
Figure 3C:
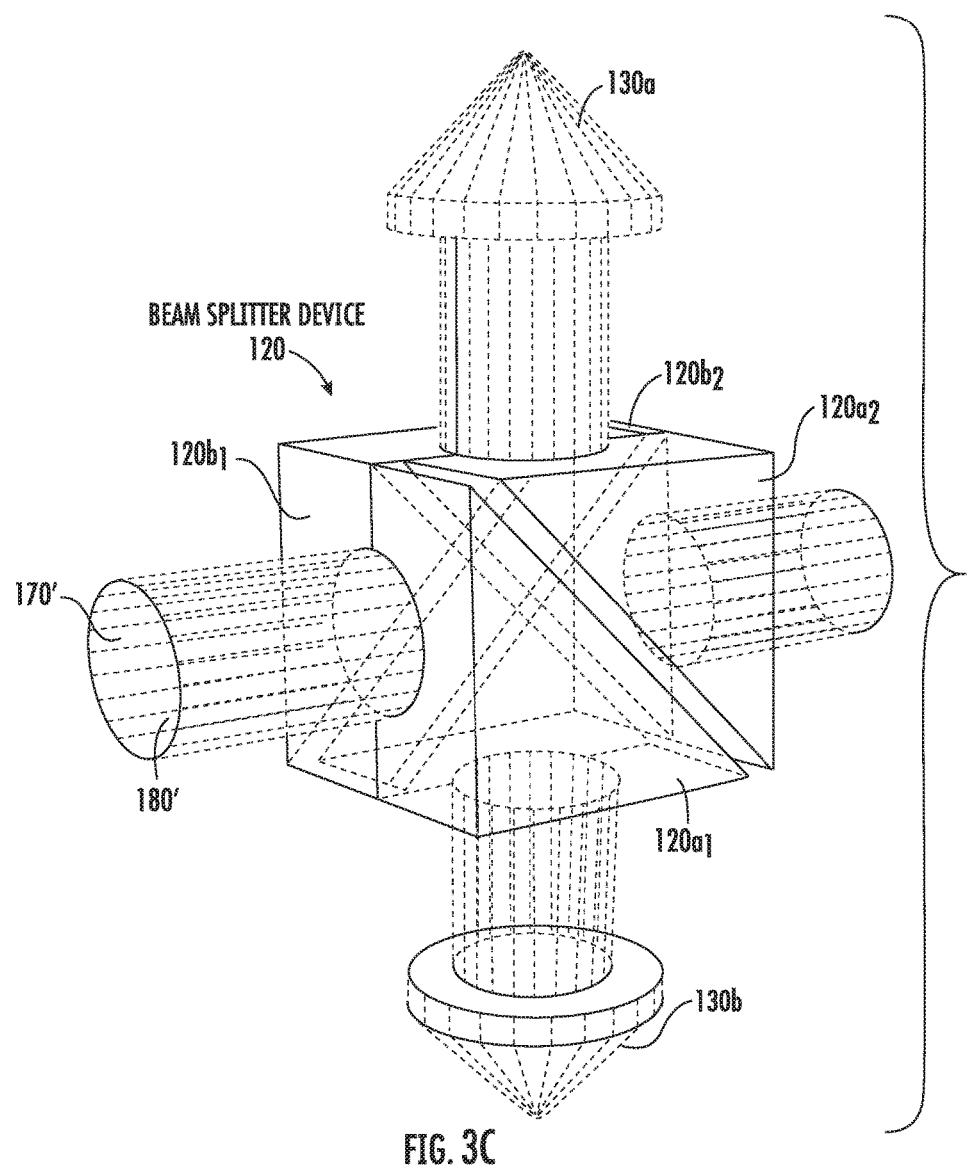

FIGS. 3A-C shows the example cone-based polarizer 100 in FIG. 1A with FIG. 3A being a basic exploded beam path view showing an input left beam portion 170' received by the polarizer that is directed by the BS part 120b of the beam splitter device 120 to the TIR cone 130a. FIG. 3B shows an input right beam portion 180' path view which is directed down to the bottom TIR cone 130b by the FS part 120a of the beam splitter device 120. FIG. 3C is a beam path view combining the paths in FIGS. 3A and 3B.

Figure 4:
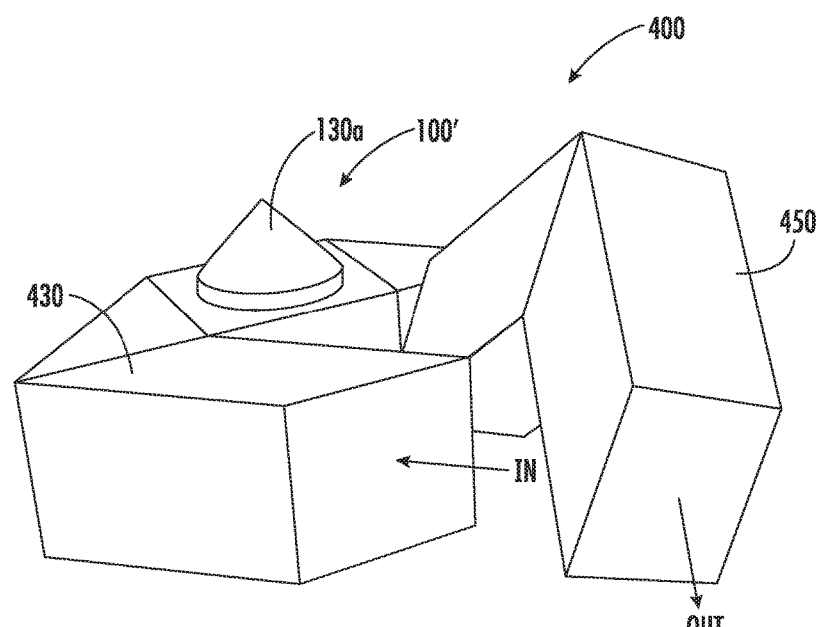
FIG. 4 shows a first example cone-based polarizer version, according to an example embodiment.

FIG. 4 shows a first example cone-based polarizer 400 comprising a core polarizer device 100' with an input white light Fresnel quarter waveplate 450 and an output half waveplate 430 for input and output beam manipulation, respectively. Polarizer 400 is used to generate radially or azimuthally polarized light from an input linearly polarized light beam. The input Fresnel quarter waveplate 450 is used to generate circularly polarized light from an input linearly polarized light beam input to the cone polarizer 100'. The Fresnel quarter waveplate 450 can be replaced with other forms of quarter waveplates including traditional crystalline monochromatic waveplates which have the disadvantage of being monochromatic unless specifically design to be achromatic, but have the advantage of being more compact. The output half waveplate 430 is rotated at an angle of 22.5° to convert the output from the cone polarizer 100' into a usable radial or azimuthal polarization beam.

Figure 5:
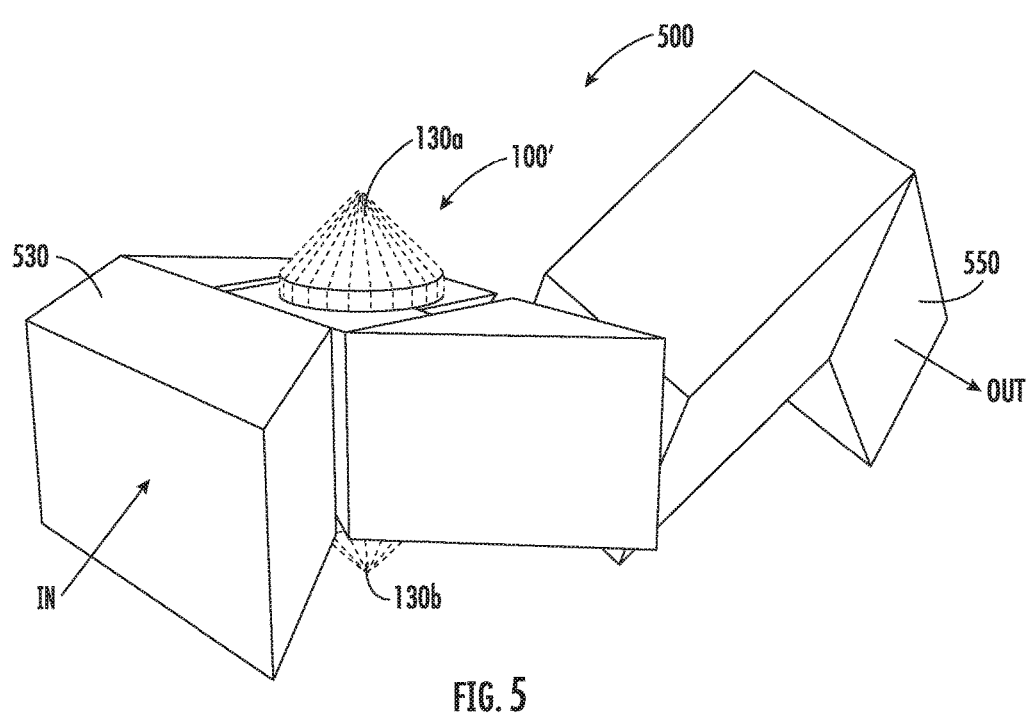
FIG. 5 shows a second example cone-based polarizer version with collinear input and output that is the collinear version of the cone polarizer shown in FIG. 4, according to an example embodiment.

FIG. 5 shows a second example cone polarizer 500 with a collinear input and output that is the collinear version of the cone-based polarizer 400 shown in FIG. 4 with the component 530 and component 550 performing the same roles as described above for the half waveplate 430 and quarter waveplate 450 respectively.

There are other disclosed aspects that manipulate the input and output polarization states of the input beam using bulk optics to increase the white light potential of the polarizer device, or to broaden the wavelength range over which the polarizer device can be operated. For example, two reflections of a linear polarized beam in the same plane provides a quarter waveplate to generate circular polarized input light. The output light from the cone generally needs a half waveplate oriented at 22.5° to generate azimuthal and radial polarized light. As described above, the 'natural output' generally needs a half waveplate at 22.5° to get generate radial and azimuthal, and this can be achieved with 4 glass reflections. This is an optical device known as a 'Fresnel Rhomb', only with 45° prisms instead of the more common smaller shallow angle which can be made from common glass.

Disclosed cone-based polarizers which generate azimuthal and radial polarization modes of light with low beam attenuating will develop new applications or improve existing applications. As describe above, currently known methods of generating structured polarization beams are either limited in size, or intricate to assembly and have a limited wavelength range. The products that result from disclosed cone-based polarizers generally benefit from simplicity, broad-band, low cost, ease of manufacture, and being suitable for high power applications.

Disclosed cone-based polarizers provide structured polarization beams efficiently, and can provide such beams over a broadband demonstrated across the visible spectrum (400 nm to 700 nm). Theoretically, disclosed cone-based polarizers can work over any wavelength regime where there are materials that transmit and have the appropriate refractive index to induce the needed phase change. For glasses this would be a wavelength of about 200 nm to 3 μm, but with crystalline materials this range can generally be extended further into the ultraviolet (UV) and out into the infrared (IR) to a wavelength of 10 μm or more.

Disclosed dual cone-based polarizers also provide a high power handling capacity. Disclosed cone-based polarizers can be made without any epoxies in the optical path to raise the power handling capacity, such as to >100 Mw/cm$^2$. Benefits of the polarization state of structured light generated by disclosed cone-based polarizers which have 1 unit of OAM, where the beam can be focused down below the diffraction limit for a far wider range of numerical apertures (NA's) than any known focusing scheme that has been verified by both theoretical predictions and simulations. Disclosed dual cone-based polarizers can thus provide a new tool with new capabilities in a variety of industrial and research applications.

Figure 6:
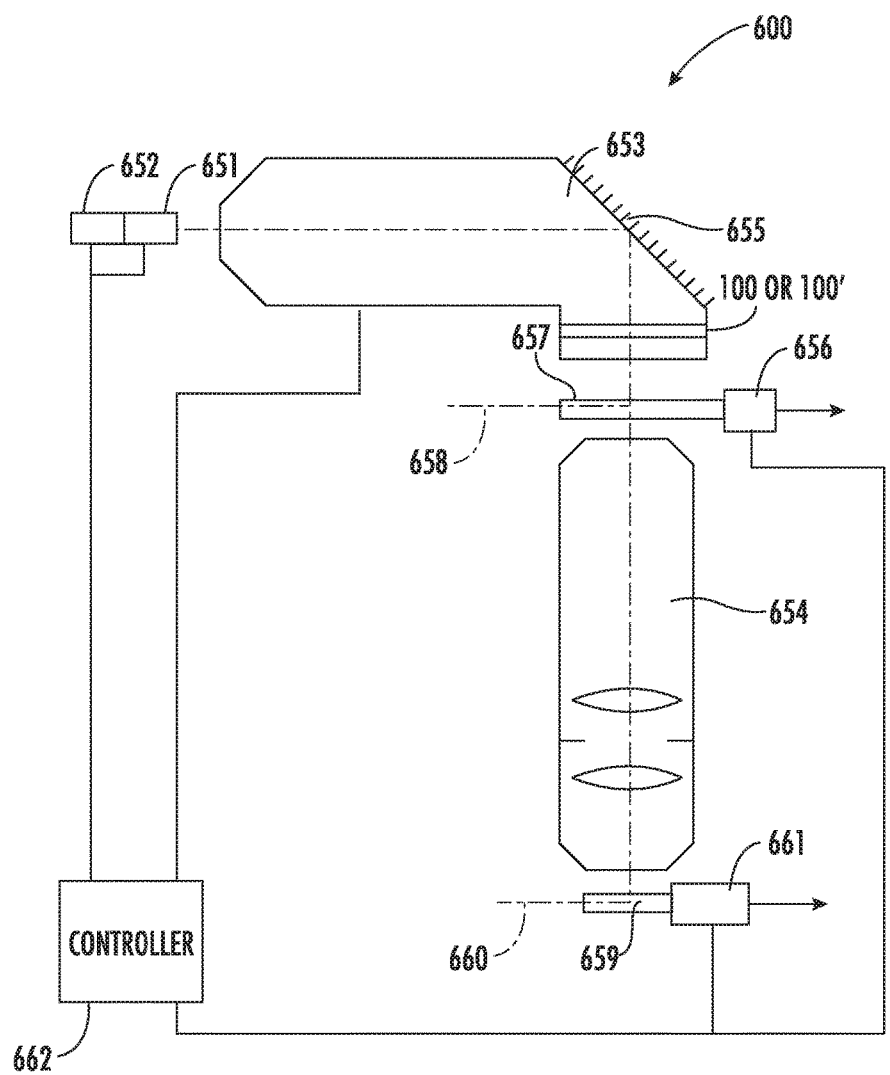
FIG. 6 shows an example photolithography apparatus including a disclosed cone-based polarizer in the beam path.

For example, disclosed cone-based polarizers will allow improved beam resolution because spot sizes are predicted to be about 25% smaller, leading to reduced printable feature size in photolithography applications including for lithography in semiconductor fabrication, enabling producing higher quality and finer geometry feature sizes products which can result in increased business opportunities for users. FIG. 6 shows an example photolithography apparatus 600 including a disclosed cone-based polarizer 100 or 100' in the beam path.

The photolithography apparatus 600 includes a wafer scanner, and a laser light source 651 with a device 652 for narrowing the bandwidth of its laser, which emits a linearly polarized light beam. An illumination system 653 generates a large, sharply defined, highly homogeneous, illuminated field that has been adapted to suit the telecentricity requirements of the projection lens 654 that follows it in the optical train. The illumination system 653 has devices for selecting an illumination mode and may, for example, be switched among conventional illumination with a variable degree of coherence, an annular illuminated field, and dipole or quadrupole illumination.

The illumination system includes a deflection mirror 655 in order to reduce its overall length. The illumination system is followed by a device 656 for holding and manipulating a photomask 657 that has been arranged such that the photomask 657 lies in an image plane 658 of the projection lens 654 and is translatable over the plane using a scanning drive. The projection lens 654 has been designed to be an axisymmetric reduction lens containing refractive optical elements only that projects a reduced image of the photomask 657 onto a wafer 659 coated with a layer of photoresist, where the wafer 659 is arranged in the image plane 660 of the projection lens 654 and is held in place by a device 661 that includes a scanning drive in order to allow translating the wafer in synchronism with the photomask 657. All of the above-described systems are controlled by a controller unit 662.

Within the illumination system 653, the deflection mirror 655 is followed by a disclosed cone-based polarizer 100 or 100' inserted into the photolithography apparatus' 600 optical train. The polarizer 100 or 100' as described above transforms incident light and adds a structured polarization being a radial or azimuthal polarization. The structured polarization lies in the plane 658 of the photomask 657 and will be carried over to the image plane 660, since there are no elements, such as mirrors or similar, following the polarizer 100 and 100' that might affect the polarization of the beam.

The structured polarization has beneficial effects for the performance of the photolithography apparatus 600 including where the beam can be focused down below the diffraction limit for a far wider range of numerical apertures (NA's) than any known focusing scheme. An azimuthally polarized beam produced by the cone polarizer 100 or 100' is predicted to reduce the focal spot size below the diffraction limit for a NA>0.5, by as much as 25%.

This Disclosure is also expected to impact research, with the new cone-based systems allowing improved polarization sensitive microscopy and vortex coronagraphs, accelerating research in these and other areas. Disclosed cone-based polarizer applications can also include the improvement of quantum communication network bandwidth through the use of structured polarization photons.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The invention claimed is:
1. A cone-based polarizer, comprising:
 a beam splitter device including a front side (FS) part and a back side (BS) part adapted for receiving a first beam portion and a second beam portion, respectively, wherein said FS part comprises two prisms including parallel first and second FS hypotenuses, and wherein said BS part comprises two prisms including parallel first and second BS hypotenuses;
 a first total internal reflection (TIR) cone positioned on top of said beam splitter device and a second TIR cone positioned on a bottom of said beam splitter device;

wherein said first and said second TIR cones are aligned to have an essentially common cone axis direction and are both configured to add a structured polarization upon retroreflecting;

wherein said first and said second FS hypotenuses have a FS TIR interface in-between and are angled at about 45° relative to said cone axis direction, and wherein said first and said second BS hypotenuses have a BS TIR interface in-between and are angled at about 90° relative to said first and said second FS hypotenuses.

2. The cone-based polarizer of claim 1, wherein said FS and said BS TIR interfaces both comprise an air gap.

3. The cone-based polarizer of claim 1, wherein said polarizer is configured so that said second beam portion reflects off said second BS hypotenuse to said TIR cone which then retroreflects said second beam portion to arrive at said first FS hypotenuse and be reflected out from said beam splitter device, and wherein said first beam portion reflects off said second FS hypotenuse to said TIR cone coupled to receive and retroreflect said first beam portion to arrive at said first BS hypotenuse and then be second reflected out of said beam splitter device.

4. The cone-based polarizer of claim 1, wherein said first TIR cone and said second TIR cone are designed and manufactured to be identical.

5. A cone-based polarizer, comprising:
an input right-angle prism for directing an input beam to a beam splitter device including a front side (FS) part and a back side (BS) part adapted for receiving a first beam portion and a second beam portion, respectively, wherein said FS part comprises two prisms including parallel first and second FS hypotenuses, and wherein said BS part comprises two prisms including parallel first and second BS hypotenuses;
a first total internal reflection (TIR) cone positioned on top of said beam splitter device and a second TIR cone positioned on a bottom of said beam splitter device,
wherein said first and said second TIR cones are aligned to have essentially common cone axis direction and are both configured to add a structured polarization upon retro-reflecting;
wherein said first and said second FS hypotenuses have a FS TIR interface in-between and are angled at about 45 degrees relative to said cone axis direction, and wherein said first and said second BS hypotenuses have a BS TIR interface in-between and are angled at about 90 degrees relative to said first and said second FS hypotenuses;
an output right-angle prism coupled to receive a beam output by said beam splitter device;
wherein said input right-angle prism is oriented to provide a reflection in about an orthogonal plane of incidence with respect to a plane of incidence of said beam splitter device to provide input path polarization shift compensation, and
wherein said output right-angle prism is oriented to provide a reflection in about an orthogonal plane of incidence with respect to said plane of incidence of said beam splitter device to provide output path polarization shift compensation.

6. The cone-based polarizer of claim 5, wherein said input path polarization shift compensation is so that a net s and p polarization shift for said first and said second beam portions input to said first TIR cone and to said second TIR cone are each essentially zero relative to a polarization state of said input beam, and wherein said output path polarization shift compensation is so that an s and p polarization shift due to all reflections from respective beams output by said first and said second TIR cones are essentially zero.

7. The cone-based polarizer of claim 5, wherein said FS and said BS TIR interfaces both comprise an air gap.

8. The cone-based polarizer of claim 5, where said cone-based polarizer comprises a unitary article.

9. The cone-based polarizer of claim 5, wherein said first TIR cone and said second TIR cone are designed and manufactured to be identical.

10. The cone-based polarizer of claim 6, wherein materials for said input right-angle prism, for said output right-angle prism, and for said TIR cones are selected such that each said reflection provides a difference in phase shift of about 45° between s and p components for an incidence angle of about 45 degrees of said first beam portion and said second beam portion.

11. A photolithography apparatus, comprising:
an illumination system for supplying a projection beam of radiation;
a first object table provided with a mask holder for holding a photomask, and connected to first positioner;
a second object table provided with a substrate holder for holding a substrate, and connected to second positioner;
a projection system for imaging an irradiated portion of said photomask onto a target portion of said substrate, and
a cone-based polarizer in a projection beam path between said illumination system and said photomask, said cone-based polarizer comprising:
a beam splitter device including a front side (FS) part and a back side (BS) part adapted for receiving a first beam portion and a second beam portion, respectively, wherein said FS part comprises two prisms including parallel first and second FS hypotenuses, and wherein said BS part comprises two prisms including parallel first and second BS hypotenuses;
a first total internal reflection (TIR) cone positioned on top of said beam splitter device and a second TIR cone positioned on a bottom of said beam splitter device,
wherein said first and said second TIR cones are aligned to have an essentially common cone axis direction and are both configured to add a structured polarization upon retroreflecting;
wherein said first and said second FS hypotenuses have a FS TIR interface in-between and are angled at about 45° relative to said cone axis direction, and wherein said first and said second BS hypotenuses have a BS TIR interface in-between and are angled at about 90° relative to said first and said second FS hypotenuses.

12. The photolithography apparatus of claim 11, wherein said FS and said BS TIR interfaces both comprise an air gap.

13. The photolithography apparatus of claim 11, wherein said cone-based polarizer is configured so that said second beam portion reflects off said second BS hypotenuse to said TIR cone which then retroreflects said second beam portion to arrive at said first FS hypotenuse and be reflected out from said beam splitter device, and wherein said first beam portion reflects off said second FS hypotenuse to said TIR cone coupled to receive and retroreflect said first beam portion to arrive at said first BS hypotenuse and then be second reflected out of said beam splitter device.

14. The photolithography apparatus of claim 11, wherein said first TIR cone and said second TIR cone are designed and manufactured to be identical.

15. The photolithography apparatus of claim 11, wherein said cone-based polarizer further comprises:
- an input right-angle prism for directing a received input beam to provide said first beam portion and said second beam portion to said beam splitter device and an output right-angle prism coupled to receive a beam output by said beam splitter device;
- wherein said input right-angle prism is oriented to provide a reflection in about an orthogonal plane of incidence with respect to a plane of incidence of said beam splitter device to provide input path polarization shift compensation, and
- wherein said output right-angle prism is oriented to provide a reflection in about an orthogonal plane of incidence with respect to said plane of incidence of said beam splitter device to provide output path polarization shift compensation.

16. The photolithography apparatus of claim 15, wherein said input path polarization shift compensation is so that a net s and p polarization shift for said first and said second beam portions input to said first TIR cone and to said second TIR cone are each essentially zero relative to a polarization state of said input beam, and
- wherein said output path polarization shift compensation is so that an s and p polarization shift due to all reflections from respective beams output by said first and said second TIR cones are essentially zero.

* * * * *